United States Patent [19]

Saruwatari

[11] Patent Number: 5,680,355
[45] Date of Patent: Oct. 21, 1997

[54] SEMICONDUCTOR STORAGE APPARATUS

[75] Inventor: Yasuhiro Saruwatari, Tokyo, Japan

[73] Assignee: NEC Corporation, Tokyo, Japan

[21] Appl. No.: 621,179

[22] Filed: Mar. 21, 1996

[30] Foreign Application Priority Data

Mar. 30, 1995 [JP] Japan ................................. 7-072808

[51] Int. Cl.$^6$ ................................. G11C 7/00; G11C 5/02
[52] U.S. Cl. ........................... 365/205; 365/203; 365/202; 365/51; 365/63
[58] Field of Search .............................. 365/205, 206, 365/203, 202, 51, 52, 63

[56] References Cited

U.S. PATENT DOCUMENTS 5,142,492 8/1992 Shimizu et al. ......................... 365/51
5,150,330 9/1992 Hag .................................... 365/51

FOREIGN PATENT DOCUMENTS 61-126683 6/1986 Japan .

*Primary Examiner*—David C. Nelms
*Assistant Examiner*—Huan Hoang
*Attorney, Agent, or Firm*—Foley & Lardner

[57] ABSTRACT

A semiconductor storage apparatus includes a memory cell array containing a plurality of memory cells arranged in an array in both directions along a row and a column on a surface of a semiconductor substrate and a plurality of digit line pairs and word lines connected to the memory cell array, sense amplifiers for amplifying potential differences between the lines of the digit line pairs, Y decoders for selecting a predetermined one of the digit line pairs, load circuits for determining the potential of the digit line pairs in response to currents flowing through the digit line pairs, balancer circuits for balancing potential levels of the digit line pairs, and precharge circuits for precharging the potentials of the digit line pairs. The semiconductor storage apparatus is constructed such that the load circuits, the balancer circuits and the precharge circuits connected to the digit line pairs are located at positions of central portions of the digit line pairs so as to divide the memory cells connected commonly to the digit line pairs such that the numbers of the memory cells may be divided substantially equally into two.

5 Claims, 8 Drawing Sheets

SEMICONDUCTOR STORAGE APPARATUS

BACKGROUND OF THE INVENTION
1. Field of the Invention

This invention relates to a semiconductor storage apparatus, and more particularly to a semiconductor storage apparatus wherein a balancer transistor and a precharge transistor are located at a central location of a digit line pair.

2. Description of the Related Art

Referring to FIG. 1, a digit line circuit of a first conventional semiconductor storage apparatus includes digit line pair (D, DB), a pair of normally-on P-channel MOS transistors P1, P2 (hereinafter referred to as loads) connected to the digit line pair, P-channel MOS transistor P3 (hereinafter referred to as balancer) for balancing the voltage levels of digit line pair (D, DB), and a pair of after-write precharge transistors P4 and P5, and is constructed in such a plan arrangement as shown in FIG. 4. Further, memory cells (A, B) of a typical SRAM are formed from Nchannel MOS transistors (N1, N2 and N3, N4) whose gates are connected to word lines (W1, W2), respectively, and operate as transfer gates between nodes of digit line pair (D, DB) and memory cells (A, B), respectively. High resistance elements r1 to r4 and N-channel MOS transistors N5 to N8 construct a pair of flip flops.

This digit line pair (D, DB) has parasitic wiring line resistances (R1, R2) of the digit line pair as well as parasitic wiring line capacitances of the digit lines and parasitic capacitances (C1, C2) of the junction capacitances of the diffused layer of the transfer gates, respectively.

Further, the loads, the balancer and the precharge transistors are disposed at the ends of the digit line pair.

Next, internal operation of the digit line circuit upon reading out (successive reading) of the semiconductor storage apparatus is described with reference to FIG. 2 which illustrates timing waveforms upon reading out.

It is assumed that the potential at memory cell node 1 is HI, the potential at node 2 is LOW, the potential at node 3 is LOW, and the potential at node 4 is HI.

In the digit line circuit, at time t0, the potential at word line W1 is HI, and digit line D has data of HI and digit line DB has data of LOW by the holding potentials of cell nodes 1 and 2 of memory cell A.

It is assumed that, between times t0 to t1, signal DEQ changes over to LOW in response to a one shot pulse generated by an address change, and after time t1, signal DEQ changes over to HI and the potential at word line W2 changes over to HIGH. Within the period between times t0 to t1, the levels at digit line pair (D, DB) are balanced, and after time t1, the potential at digit line D changes over to the LOW level and the potential at digit line DB changes over to the HI level by held data of cell nodes (3, 4) of memory cell B.

The operation of balancing the levels of a digit line pair and reading out inverted data is a technique used usually since the delay time which is required for the capacity of a cell to invert the digit line levels can be reduced by balancing the digit line levels once to an equal level. A potential difference between digit line pair (D, DB) is received and amplified by a sense amplifier to perform a reading out operation.

Referring to FIG. 3 which shows timing waveforms upon reading after writing, since, upon reading after writing, the potentials at digital line pair (D, DB) immediately after writing are in a fully swung condition to HI and LOW, an operation of precharging the level at one of the digit lines, which has dropped to the LOW level by signal WEQ generated at the end of writing, to the level of power source VCC is performed in addition to the balancing operation to read out the memory.

FIG. 5 is a plan arrangement diagram of a second conventional example; FIG. 6 is a timing chart of operation of the second conventional example; and FIG. 7 is a timing chart upon reading after writing.

The second example has a construction wherein, in order to reduce the arrangement resistance, capacitance and so forth of a digit line, the digit line is divided into two lines, and loads, a balancer, sense amplifiers and so forth are provided for each of the digit lines. Since the wiring line resistance and capacitance of each of the digit lines can be reduced to one half by the construction, the balancing time and the precharging time are reduced when compared with the first example. While the circuit construction is the same as that of the first prior art shown in FIG. 1, the loads, balancer, precharge transistors, sense amplifiers and Y decoder are required for each of the digit lines.

The semiconductor storage apparatus of the present second conventional example is constructed such that the loads, balancer and precharge transistors are disposed at peripheral locations while the Y decoder and the sense amplifiers are disposed at central locations. FIG. 8 shows a plan arrangement constructive view in which the arrangement areas of the circuits at the central locations and the peripheral locations are reversed to those of FIG. 5. When a semiconductor storage apparatus is constructed, which one of the plan arrangements shown in FIGS. 4, 5 and 8 should be used depends upon the construction of the other peripheral circuits, the positions of pads, the numbers of inputs and outputs, the specifications and so forth, and an optimum construction is selected.

Due to an increase in length of a digit line caused by employment of a thin film by a process and by an increase in storage capacity in recent years and due to an increase of the number of cells connected to a digit line, the parasitic wiring line resistance and parasitic capacitance of a digit line have increased. Therefore, if loads, a balancer and precharge transistors are disposed at an end of a digit line pair as in the first conventional example, then there is a problem in that the parasitic wiring line resistance and the parasitic capacitance of the digit line become high and consequently the balancing time and the precharging time become long.

Meanwhile, where a digit line is divided into two lines as in the second conventional example, although the balancing time and the precharging time can be made short, since a peripheral circuit including loads, a balancer, precharger transistors, sense amplifiers and a Y decoder is required for each of the divisionally arranged upper and lower digit lines, there is a problem in increase in chip size of a semiconductor storage apparatus and complication in logic of peripheral circuits.

Further, in a semiconductor storage apparatus of a multiple bit output, since it usually has input/output pads along a periphery thereof, if a circuit of a reading out system such as a sense amplifier is arranged along a direction of one of the major sides of the chip as in the first conventional example, then a long distance is required to the output pad, and consequently, the wiring lines must be laid over a long distance, resulting in a problem in increase in chip area and elongation of the read-out time. In the plan arrangement construction of the second conventional example shown in FIG. 8, the distance over which wiring lines are laid from a sense amplifier to an output pad can be reduced by the circuit construction. However, as described above, it has a problem in increase in chip size and complication in logic of peripheral circuits by division of a digit line.

SUMMARY OF THE INVENTION

Accordingly, it is an object of the present invention to provide a semiconductor storage apparatus which can reduce, taking the problems described above into consideration, the balancing time and the precharging time of a digit line pair without division of the digit line pair.

It is another object of the present invention to provide a semiconductor storage apparatus wherein the distance over which a wiring line is laid from a sense amplifier to an output pad can be reduced to reduce the read-out time without division of a digit line pair.

According to the present invention, a semiconductor storage apparatus, which includes a memory cell array including a plurality of memory cells arranged in an array in both directions along a row and a column on a surface of a semiconductor substrate, a plurality of digit line pairs for interconnecting the memory cells commonly in the individual columns, and a plurality of word lines for interconnecting the memory cells commonly in the individual rows, a plurality of sense amplifiers individually connected to the digit line pairs for amplifying potential differences between the lines of the digit line pairs in response to an activation signal, a plurality of Y decoders individually connected to the digit line pairs for selecting a predetermined one of the digit line pairs, a plurality of load circuits individually connected to the digit line pairs for determining the potentials of the digit line pairs in response to currents flowing through the digit line pairs, a plurality of balancer circuits individually connected to the digit line pairs for balancing potential levels of the digit line pairs, and a plurality of precharge circuits individually connected to the digit line pairs for precharging the potentials of the digit line pairs, is constructed such that the load circuits, the balancer circuits and the precharge circuits connected to the digit line pairs are located at positions of central portions of the digit line pairs so as to divide the memory cells connected commonly to the digit line pairs so that the numbers of the memory cells may be divided substantially equally into two.

The semiconductor storage apparatus may be constructed such that one of the Y decoders and the corresponding sense amplifier are connected to one end of the corresponding digit line pairs, and a corresponding Y decoder and a corresponding sense amplifier are arranged at and connected to the opposite end of another digital line pair adjacent to the first digit line pair.

Further, the semiconductor storage apparatus may be constructed such that the n Y decoders and the n sense amplifiers are connected to the same ends of the corresponding digit line pairs in one direction, n being a positive integral number, and the corresponding Y decoders and corresponding sense amplifiers are arranged at and connected to the opposite ends of the n digital line pairs adjacent to the n digit line pairs in the opposite direction.

The above and other objects, features, and advantages of the present invention will become apparent from the following description based on the accompanying drawings which illustrate an example of a preferred embodiment of the present invention.

BRIEF DESCRIPTION OF THE DRAWINGS

FIG. 9(A) is a circuit diagram showing a construction of a digit line circuit of the present embodiment and FIG. 9(B) is a plan arrangement constructive view of the digit line circuit of the present embodiment;

DETAILED DESCRIPTION OF THE PREFERRED EMBODIMENTS

Figure 1:
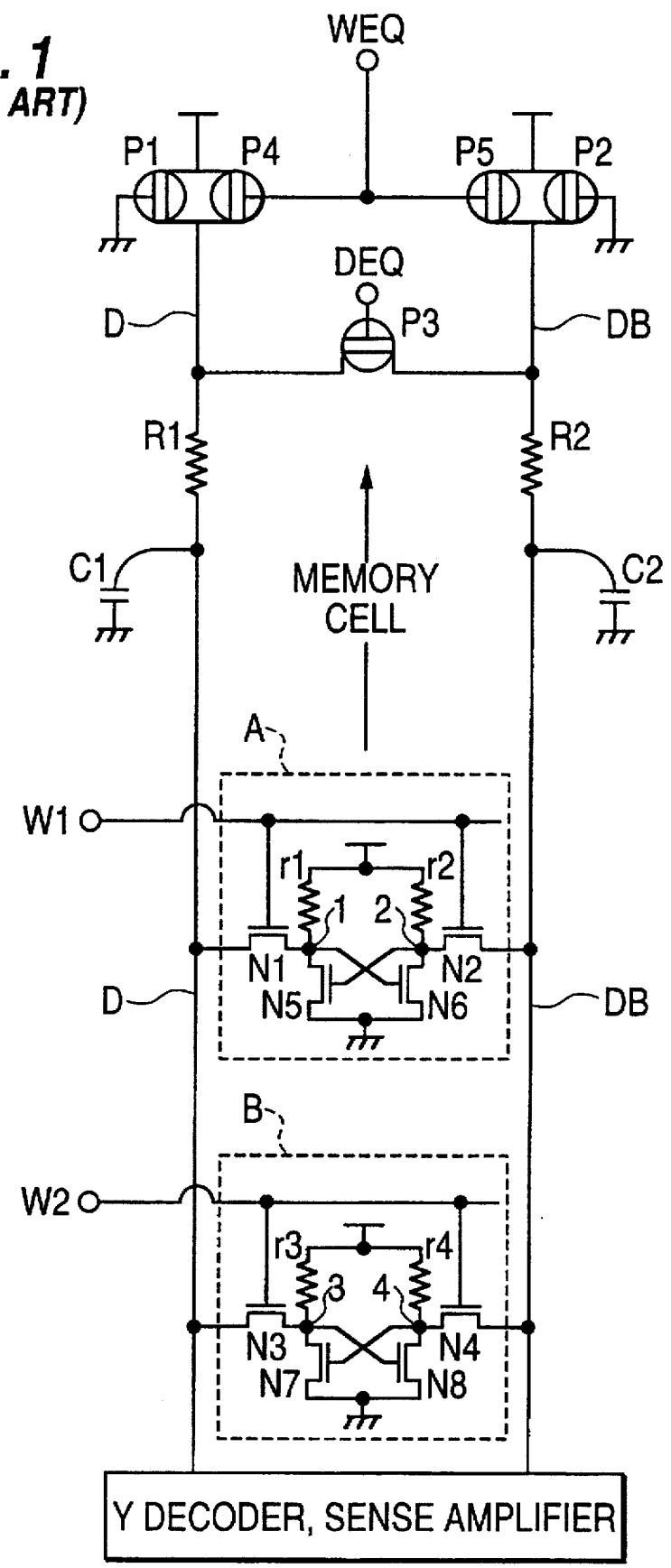
FIG. 1 is a circuit diagram showing a digit line circuit construction of a first conventional example.
Figure 2:
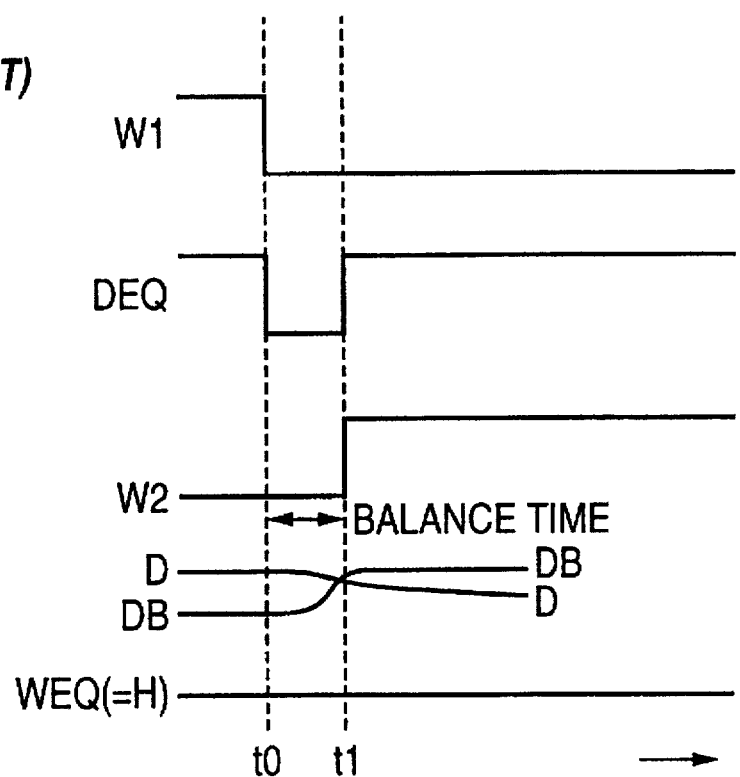
FIG. 2 is a timing waveform diagram of the first conventional example upon reading.
Figure 3:
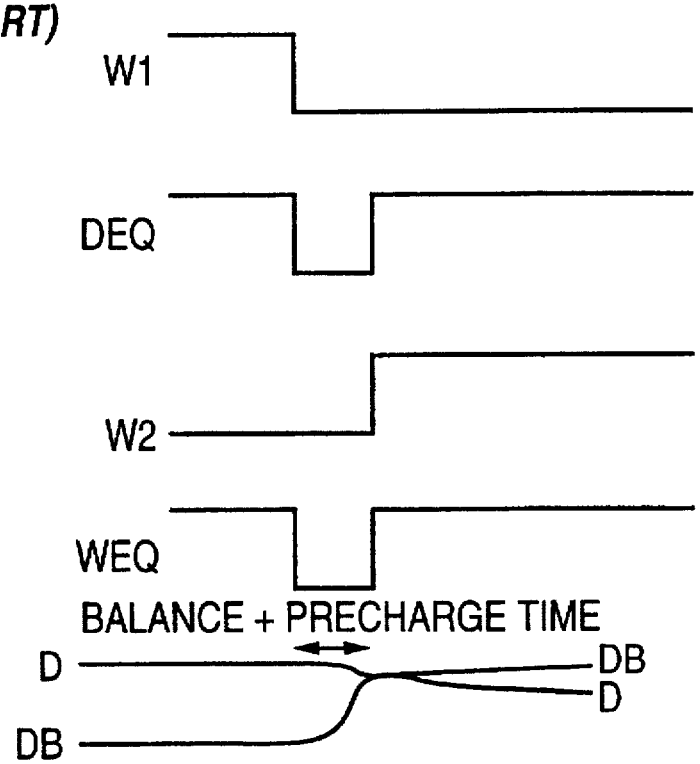
FIG. 3 is a timing waveform diagram of the first conventional example upon reading after writing.
Figure 4:
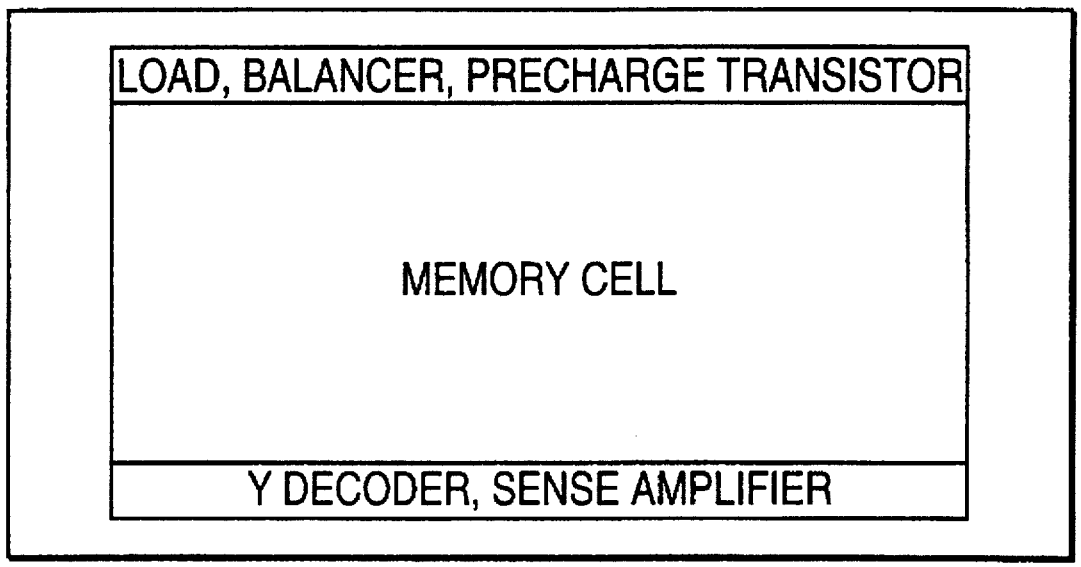
FIG. 4 is a plan arrangement constructive view of the digit line circuit of the first conventional example.
Figure 5:
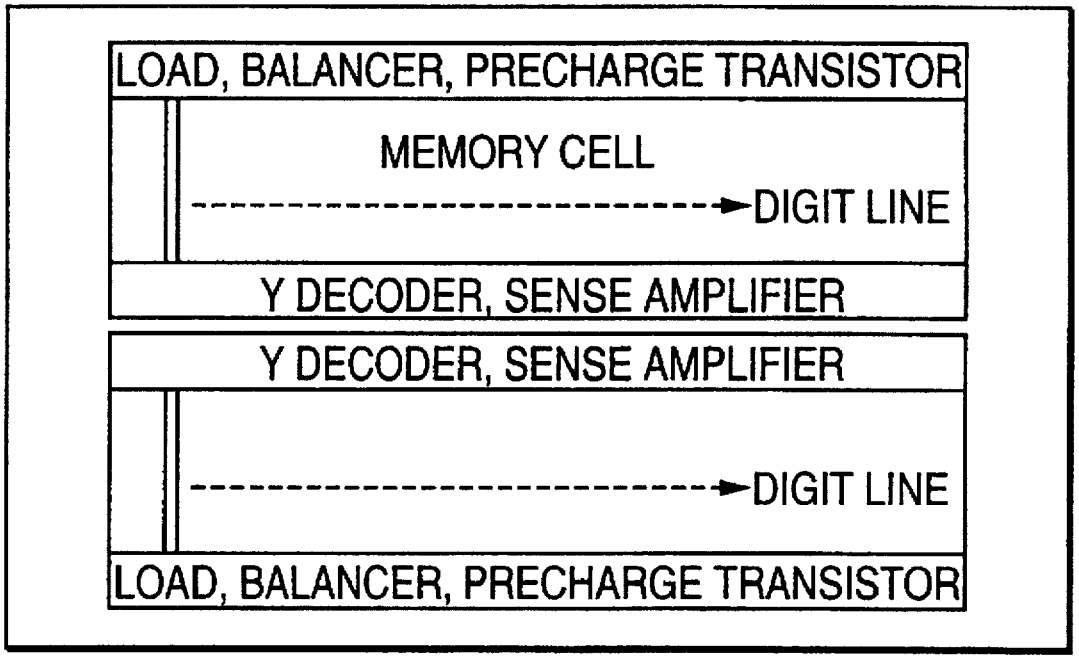
FIG. 5 is a plan arrangement constructive view of a digit line circuit of a second conventional example.
Figure 6:
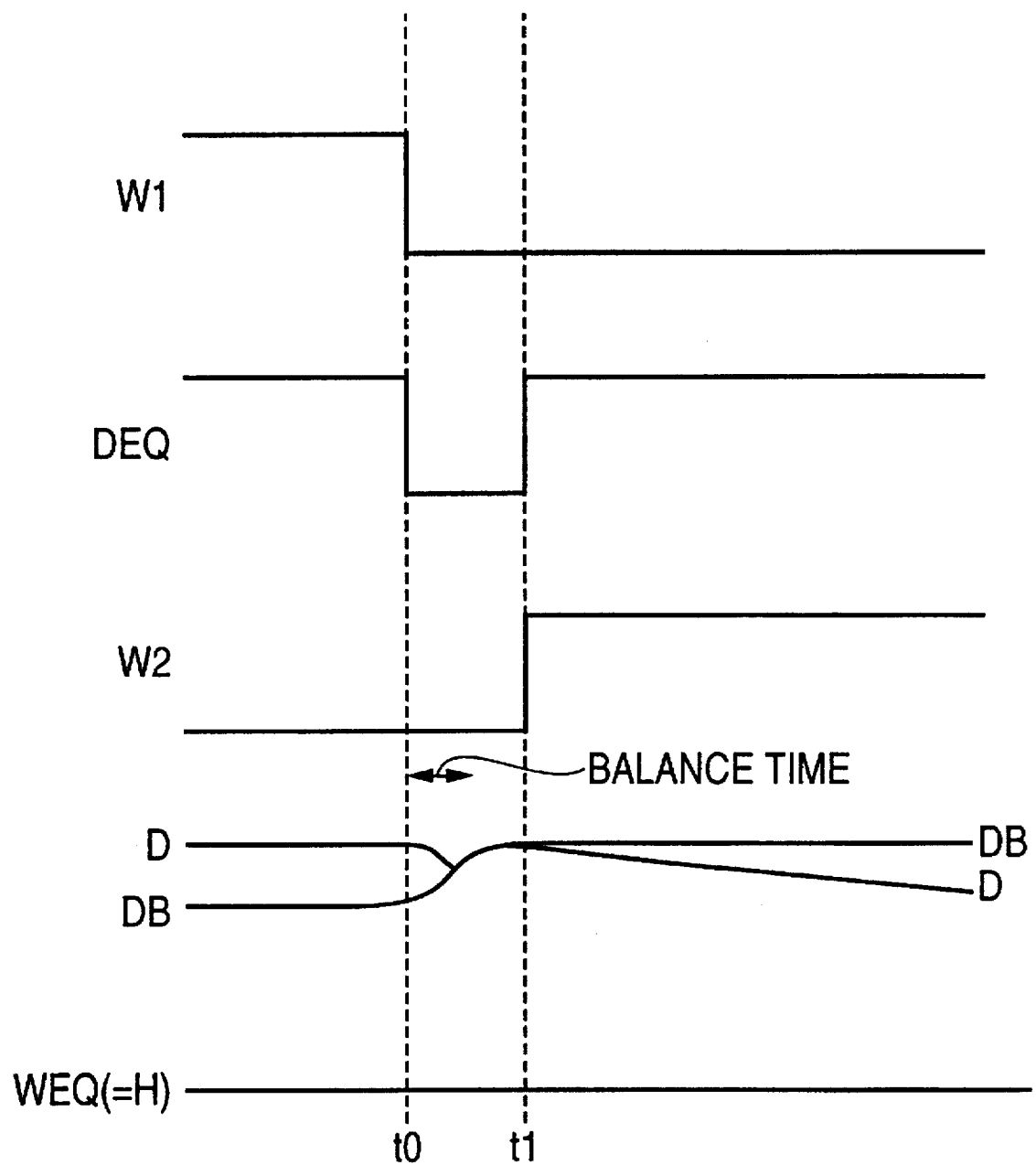
FIG. 6 is a timing waveform diagram of the second conventional example upon reading after writing.
Figure 7:
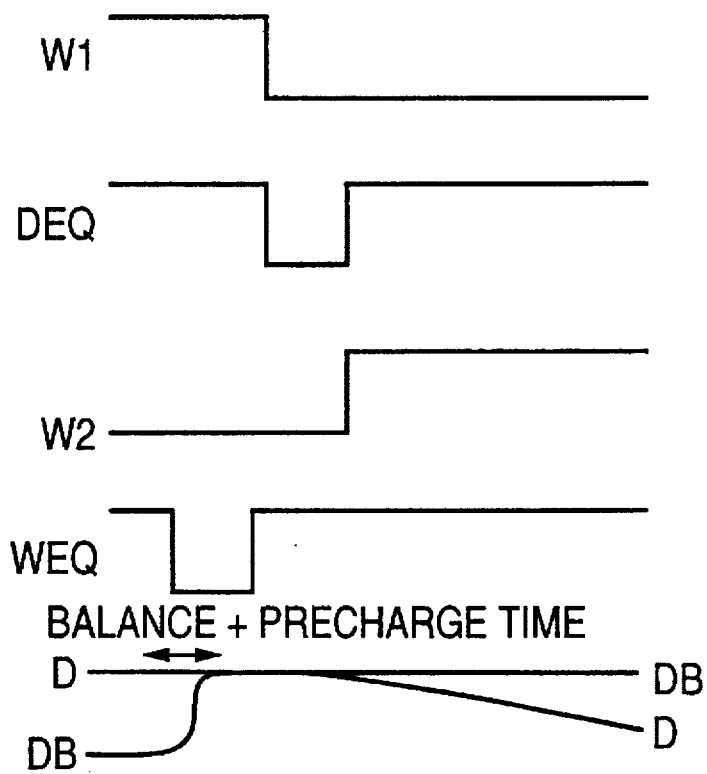
FIG. 7 is a timing waveform diagram of the second conventional example upon reading after writing.
Figure 8:
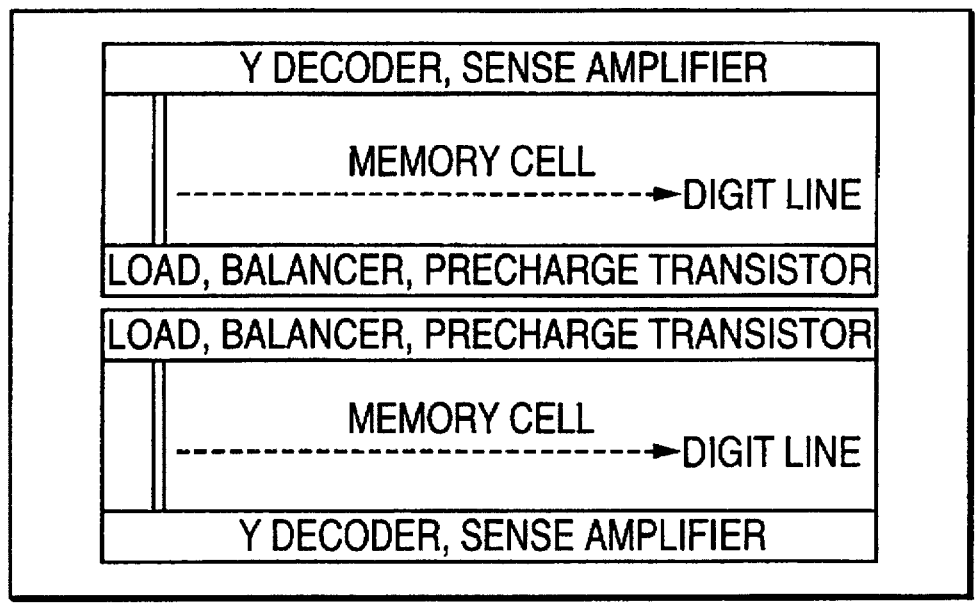
FIG. 8 is a plan arrangement constructive view of another digit line circuit of the second conventional example.
Figure 9A:
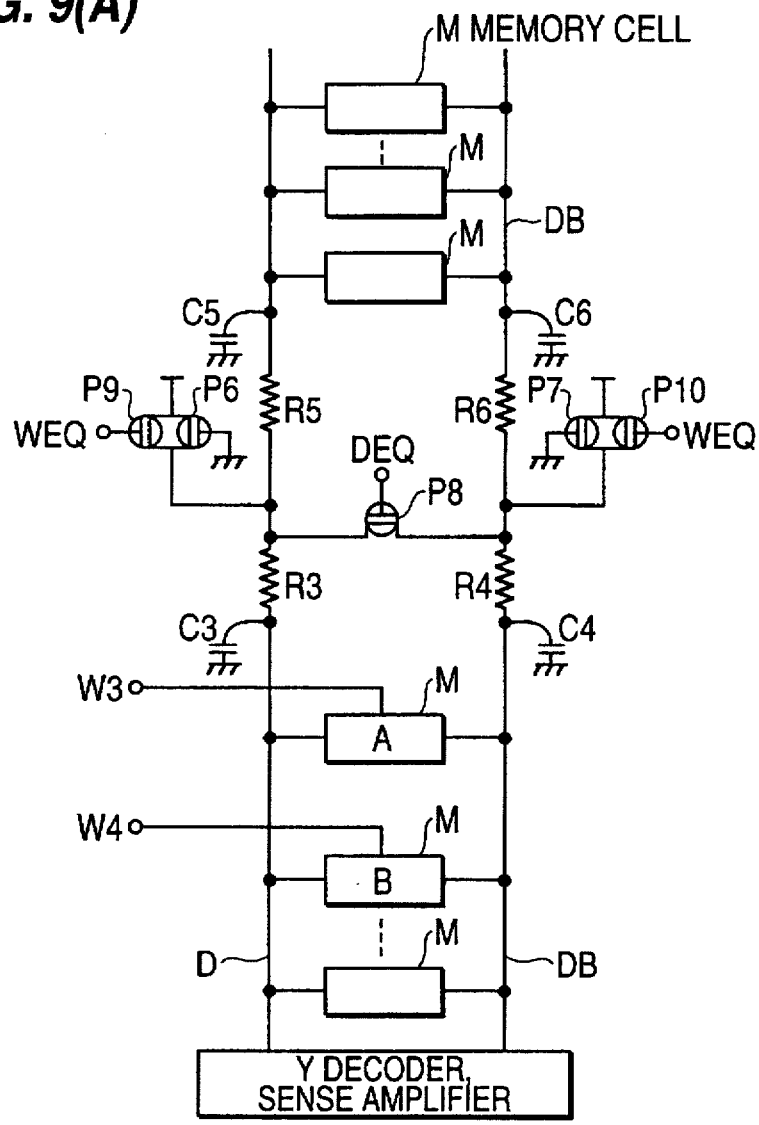
FIGS. 9(A) and 9(B) show is a view showing a construction of a semiconductor storage apparatus of a first embodiment of the present invention.

The present invention is described below with reference to the drawings. FIG. 9(A) is a circuit diagram of a digit line circuit of a semiconductor storage apparatus of a first embodiment of the present invention. Referring to FIG. 9(A), the semiconductor storage apparatus of the first embodiment of the present invention includes a pair of load transistors P6 and P7, balancer transistor P8, and a pair of precharge transistors P9 and P10, all located at a central location of digit line pair (D, DB). Accordingly, the semiconductor storage apparatus has parasitic wiring line resistances (R3, R4) and parasitic capacitances (C3, C4) on a lower side half of digit line pair (D, DB) and parasitic wiring line resistances (R5, R6) and parasitic capacitances (C5, C6) on an upper side half of digit line pair (D, DB) with respect to load transistors P6 and P7, balancer transistor P8 and precharge transistors P9 and P10.

Figure 9B:
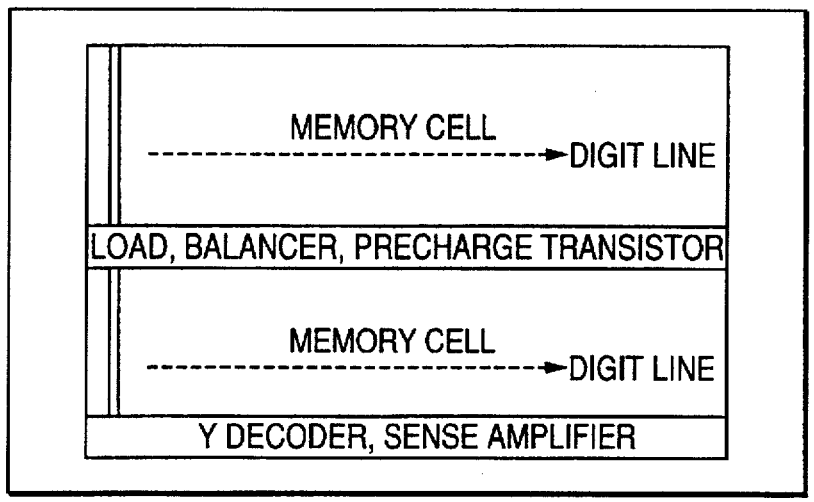

FIG. 9(B) is a plan arrangement view of the present embodiment. By the present plan arrangement construction, balancing and precharging are performed from the center of the digit lines, and consequently, the distances from the loads, balancer and precharge transistors to a cell at the farthest ends of the digit lines can be reduced comparing with those of the prior art.

Figure 10:
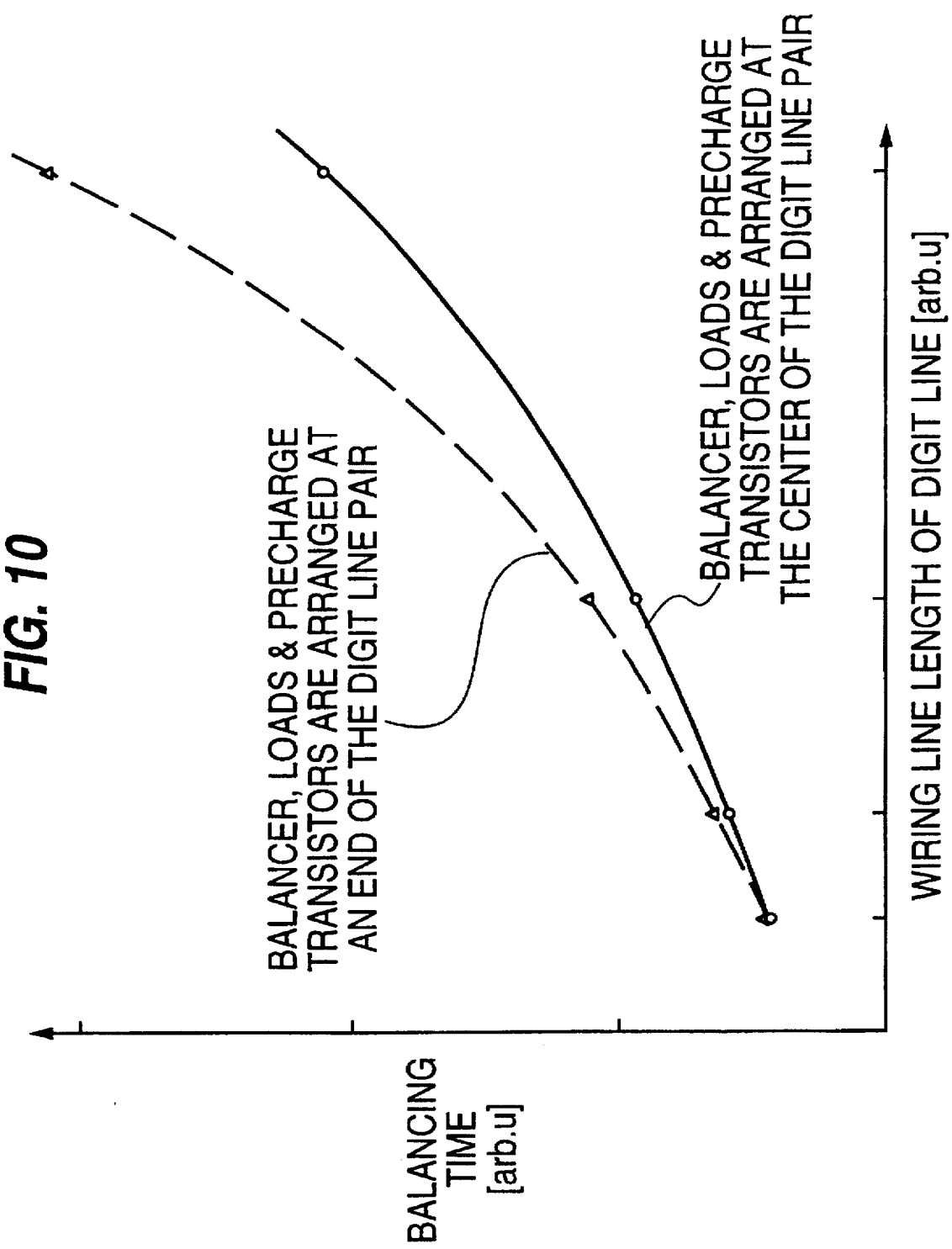
FIG. 10 is a diagrams showing relationships between a balancing time and a digit line length in the first embodiment of the present invention and the conventional example.

FIG. 10 shows the relationship between the wiring line length (it is assumed that also the wiring line capacitances and the wiring line resistances increase in proportion to the wiring line length) and the balancing time upon reading after writing (the balancing time is defined as a time required until $\Delta=10$ mV is reached because a full balance cannot be reached if a next word is received during balancing) when the balancer, loads and precharge transistors are arranged at the center of the digit line pair and when they are arranged at an end of the digit line pair.

Referring to FIG. 10, it can be seen that the balancing and precharging times are shorter when the balancer, loads and precharge transistors are arranged at the center of the digit line pair than when they are arranged at an end of the digit line pair. Particularly it can be seen that the difference in time increases as the capacitances and the resistances of the digit lines increase.

Figure 11:
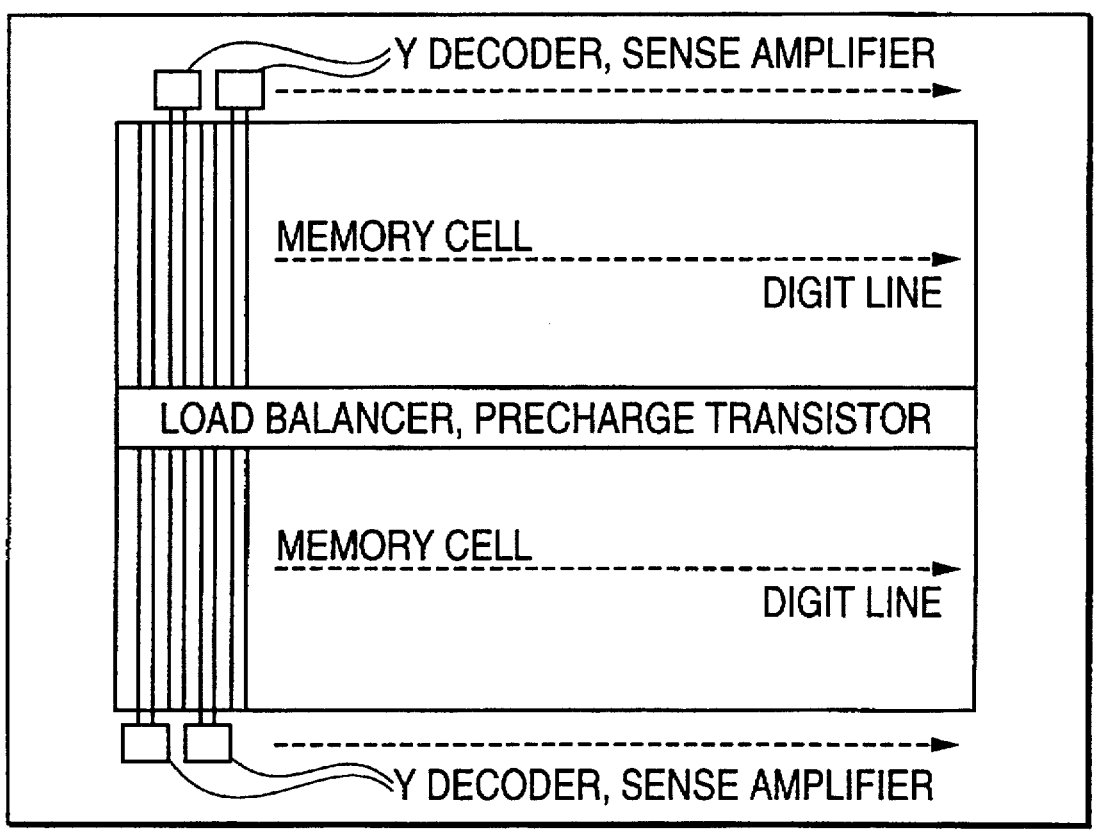
FIG. 11 is a plan arrangement constructive view of a digit line circuit of a semiconductor storage apparatus of a second embodiment of the present invention.

Next, a semiconductor storage apparatus of a second embodiment of the present invention is described. FIG. 11 is a plan arrangement view of the semiconductor storage apparatus of the second embodiment of the present invention. The present embodiment is different from the first embodiment in that Y decoders and sense amplifiers are disposed above and below digit lines of every other digit line pair, and the other construction of the digit line circuit is the same as that of the first embodiment.

According to such an arrangement construction as described above, Y decoders and sense amplifiers are required at upper and lower locations. However, since they are disposed for every other alternate digit line pair, a greater margin is provided to the pitch in arrangement of the digit line pairs, and the chip size may be made equal to that in the first embodiment. Particularly, where the chip is of a multiple bit system of an 8 bit output or the like and has output terminals in 4-bit sets along upper and lower longitudinal sides thereof, with the construction of the first embodiment, in order to transmit data outputted from the sense amplifiers to the upper side, a long distance is required to lay the wiring line, resulting in increase in chip size and delay in access.

With the construction of the present embodiment, however, the sense amplifiers located on the upper side can transmit data to the output terminals on the upper side while the sense amplifiers located on the lower side can transmit data to the output terminals on the lower side. In other words, by the arrangement construction of the second embodiment, the semiconductor storage apparatus of a multiple bit system can be constructed with wiring lines of comparatively short laid distances.

While, in the description of the present embodiment, the Y decoders and the sense amplifiers are described as being provided for every other alternate digit line pair, it is apparent that they can be provided a plurality of digits apart such as two digits apart or four digits apart.

As described above, according to the present invention, by arranging a balancer, loads and precharge transistors of a digit line pair at a central portion of the digit line pair, there is an effect that the balancing and precharging times of the digit line can be reduced without inviting an increase in chip size by division of a digit line pair. This is particularly effective where the parasitic capacitances of the digit lines are large.

Further, by arranging Y decoders and sense amplifiers alternately at upper and lower locations for every other digit line pair or a plurality of digits apart, there is an effect that, in a semiconductor storage apparatus of a multiple bit output, wiring of wiring lines from the sense amplifiers to output pads can be facilitated and the wiring lines can be reduced in length, and further reduction of the chip area and further reduction of the read-out time can be achieved.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor storage apparatus comprising:
    a memory cell array including a plurality of memory cells arranged in an array of rows and columns on a surface of a semiconductor substrate, a plurality of digit line pairs for interconnecting said memory cells commonly in the individual columns, and a plurality of word lines for interconnecting said memory cells commonly in the individual rows;
    a plurality of sense amplifiers individually connected to said digit line pairs for amplifying potential differences between the lines of said digit line pairs in response to an activation signal;
    a plurality of Y decoders individually connected to said digit line pairs for selecting a predetermined one of said digit line pairs;
    a plurality of load circuits individually connected to said digit line pairs for determining the potentials of said digit line pairs in response to currents flowing through said digit line pairs;
    a plurality of balancer circuits individually connected to said digit line pairs for balancing potential levels of said digit line pairs; and
    a plurality of precharge circuits individually connected to said digit line pairs for precharging the potentials of said digit line pairs,
    said load circuits, said balancer circuits and said precharge circuits being located at positions of central portions of said digit line pairs so as to divide said memory cells connected commonly to said digit line pairs so that the numbers of said memory cells are divided substantially equally into two, and
    one of said Y decoders and a corresponding sense amplifier are connected to a first digit line pair at a first end, and another of said Y decoders and a corresponding sense amplifier are connected to a second digit line pair which is adjacent to the first digit line pair at a second end which is opposite to the first end.

2. A semiconductor storage apparatus comprising:
    a memory cell array including a plurality of memory cells arranged in an array of rows and columns on a surface of a semiconductor substrate, a plurality of digit line pairs for interconnecting said memory cells commonly in the individual columns, and a plurality of word lines for interconnecting said memory cells commonly in the individual rows;
    a plurality of sense amplifiers individually connected to said digit line pairs for amplifying potential differences between the lines of said digit line pairs in response to an activation signal;
    a plurality of Y decoders individually connected to said digit line pairs for selecting a predetermined one of said digit line pairs;
    a plurality of load circuits individually connected to said digit line pairs for determining the potentials of said digit line pairs in response to currents flowing through said digit line pairs;
    a plurality of balancer circuits individually connected to said digit line pairs for balancing potential levels of said digit line pairs; and
    a plurality of precharge circuits individually connected to said digit line pairs for precharging the potentials of said digit line pairs,
    said load circuits, said balancer circuits and said precharge circuits being located at positions of central portions of said digit line pairs so as to divide said memory cells connected commonly to said digit line pairs so that the numbers of said memory cells are divided substantially equally into two, and
    a first set of said Y decoders and corresponding sense amplifiers being connected to a first end of the corresponding said digit line pairs and a second set of said Y decoders and corresponding sense amplifiers being connected to a second end of the corresponding digit line pairs, said first and second ends being opposite ends and said Y decoders and corresponding sense amplifiers in said first set being alternately arranged with said Y decoders and corresponding sense amplifiers in said second set.

3. A semiconductor storage apparatus comprising:

a memory cell array including a plurality of memory cells arranged in an array of n rows and m columns;

m digit line pairs for interconnecting said memory cells commonly in the individual columns;

n word lines for interconnecting said memory cells commonly in the individual rows;

m sense amplifiers individually connected to said digit line pairs for amplifying potential differences between the lines of said digit line pairs in response to an activation signal;

m Y decoders individually connected to said digit line pairs for selecting a predetermined one of said digit line pairs;

m load circuits individually connected to said digit line pairs for determining the potentials of said digit line pairs in response to currents flowing through said digit line pairs;

m balancer circuits individually connected to said digit line pairs for balancing potential levels of said digit line pairs; and m precharge circuits individually connected to said digit line pairs for precharging the potentials of said digit line pairs, wherein said load circuits, said balancer circuits and said precharge circuits are arranged at central portions of said digit line pairs so as to divide said n x m memory cells connected commonly to said digit line pairs into two n/2 x m memory cells, and wherein one of said Y decoders and a corresponding sense amplifier are connected to a first digit line pair at a first end, and another of said Y decoders and a corresponding sense amplifier are connected to a second digit line pair which is adjacent to the first digit line pair at a second end which is opposite to the first end.

4. A semiconductor storage apparatus as recited in claim 3, wherein a first set of m/2 Y decoders and m/2 sense amplifiers are connected to the first end and a second set of m/2 Y decoders and m/2 sense amplifiers are connected to the second end.

5. A semiconductor storage apparatus as recited in claim 4, wherein said m/2 Y decoders and m/2 sense amplifiers in said first set are alternately arranged with said m/2 Y decoders and m/2 sense amplifiers in said second set.

* * * * *